United States Patent
Lilak et al.

(10) Patent No.: US 11,049,861 B2
(45) Date of Patent: Jun. 29, 2021

(54) METHOD, DEVICE AND SYSTEM TO PROVIDE CAPACITANCE FOR A DYNAMIC RANDOM ACCESS MEMORY CELL

(71) Applicant: Intel Corporation, Santa Clara, CA (US)

(72) Inventors: Aaron Lilak, Beaverton, OR (US); Patrick Morrow, Portland, OR (US); Rishabh Mehandru, Portland, OR (US); Donald W. Nelson, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/747,692

(22) PCT Filed: Sep. 25, 2015

(86) PCT No.: PCT/US2015/052455
§ 371 (c)(1),
(2) Date: Jan. 25, 2018

(87) PCT Pub. No.: WO2017/052645
PCT Pub. Date: Mar. 30, 2017

(65) Prior Publication Data
US 2018/0219012 A1    Aug. 2, 2018

(51) Int. Cl.
*H01L 27/108* (2006.01)
(52) U.S. Cl.
CPC ...... *H01L 27/1082* (2013.01); *H01L 27/1087* (2013.01); *H01L 27/10832* (2013.01); *H01L 27/10858* (2013.01); *H01L 27/10867* (2013.01)

(58) Field of Classification Search
CPC .......... H01L 27/1082; H01L 27/10832; H01L 27/10858; H01L 27/10867; H01L 27/1087;
(Continued)

(56) References Cited

U.S. PATENT DOCUMENTS 6,380,028 B1    4/2002  Kim
2002/0153553 A1  10/2002  Kastner et al.
(Continued)

FOREIGN PATENT DOCUMENTS

JP         10-084090         3/1998

OTHER PUBLICATIONS

International Preliminary Search Report for International Patent Application No. PCT/US2015/052455, dated Apr. 5, 2018, 10 pages.
(Continued)

*Primary Examiner* — Shahed Ahmed
(74) *Attorney, Agent, or Firm* — Schwabe, Williamson & Wyatt, P.C.

(57) ABSTRACT

Techniques and mechanisms to provide capacitance with a memory cell of an integrated circuit. In an embodiment, a transistor of the memory cell includes structures variously formed in or on a first side of a semiconductor substrate. After processing to form the transistor structures, thinning is performed to expose a second side of the semiconductor substrate, the second side opposite the first side. Processing in or on the exposed second side of the semiconductor substrate is subsequently performed to form in the semiconductor substrate a capacitor that extends to couple to one of the transistor structures. In another embodiment, the capacitor is coupled to accumulate charge based on activation of a channel of the transistor. The capacitor is further coupled to send charge from the memory cell via the second side.

14 Claims, 10 Drawing Sheets

(58) Field of Classification Search
CPC ....... H01L 27/10873–10879; H01L 28/40–92; H01L 27/10805–10841; H01L 27/1085–1087
See application file for complete search history.

(56) References Cited

U.S. PATENT DOCUMENTS

| | | | |
|---|---|---|---|
| 2003/0057487 A1* | 3/2003 | Yamada | H01L 21/76264 257/347 |
| 2004/0082117 A1 | 4/2004 | Kastner et al. | |
| 2004/0188739 A1* | 9/2004 | Takenaka | H01L 27/10829 257/301 |
| 2005/0026359 A1* | 2/2005 | Voigt | H01L 29/945 438/243 |
| 2009/0174031 A1* | 7/2009 | Wang | G11C 11/404 257/532 |
| 2010/0308390 A1 | 12/2010 | Puget et al. | |
| 2011/0133310 A1* | 6/2011 | Anderson | H01L 21/76224 257/532 |
| 2012/0025288 A1* | 2/2012 | Doris | H01L 27/1203 257/301 |
| 2016/0181253 A1* | 6/2016 | Donaton | H01L 21/02318 257/301 |
| 2016/0198106 A1* | 7/2016 | Wakano | H04N 5/37455 348/308 |
| 2017/0084220 A1* | 3/2017 | Im | G09G 3/3233 |

OTHER PUBLICATIONS

International Search Report and Written Opinion for International Patent Application No. PCT/US2015/052455 dated Jun. 24, 2016, 11 pgs.
Office Action from Taiwan Patent Application No. 105126629, dated Nov. 29, 2019, 19 pgs.
Office Action from Taiwan Patent Application No. 105126629, dated Jun. 29, 2020, 9 pgs.

* cited by examiner

METHOD, DEVICE AND SYSTEM TO PROVIDE CAPACITANCE FOR A DYNAMIC RANDOM ACCESS MEMORY CELL

CROSS-REFERENCE TO RELATED APPLICATION

This patent application is a U.S. National Phase Application under 35 U.S.C. § 371 of International Application No. PCT/US2015/052455, filed Sep. 25, 2015, entitled "METHOD, DEVICE AND SYSTEM TO PROVIDE CAPACITANCE FOR A DYNAMIC RANDOM ACCESS MEMORY CELL," which designates the United States of America, the entire disclosure of which is hereby incorporated by reference in its entirety and for all purposes.

BACKGROUND

1. Technical Field

Embodiments discussed herein relate generally to the field of integrated circuits and more specifically, but not exclusively, to structures for providing capacitance in a memory cell.

2. Background Art

Figure 1A:
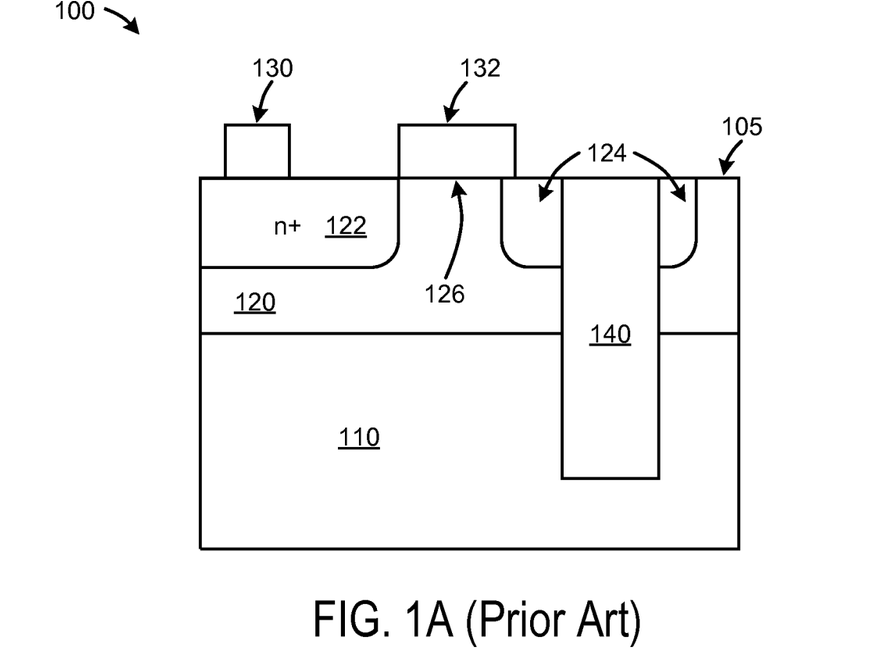
FIGS. 1A, 1B are cross-sectional views of integrated circuitry structures in conventional memory devices.

Various types of memory cells, such as those of a dynamic random access memory (DRAM) device, include capacitors for storing charge to represent data bit values. In one typical memory device 100 shown in FIG. 1A, a substrate includes a p-type semiconductor material 110 and an epitaxial layer 120 thereon, where a memory cell includes transistor structures variously formed in or on a side 105 of the substrate. One such transistor includes n+ doped regions 122, 124 (to operate as a source and a drain) and a gate 132 formed on side 105 at a region 126 between n+ doped regions 122, 124. During operation of memory device 100, terminal contact 130 and gate 132 variously receive signaling to facilitate activation of a channel between regions 122, 124. The memory cell also includes a capacitor 140 extending vertically down from side 105 into the substrate, where capacitor 140 includes a dielectric to accumulate charge exchanged via the channel. Currently, memory technologies utilize deep trench structures, such as those to accommodate capacitor 140, that require very high etch aspect ratios and processes that are capable of depositing dielectric layers in a conformal manner within such deep trench structures.

Figure 1B:
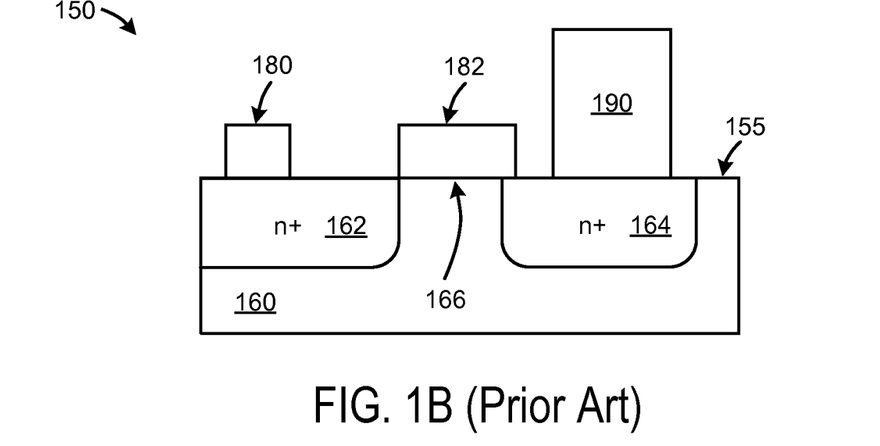

FIG. 1B shows another conventional memory device 150 that, similarly, has transistor structures variously disposed in or on a side 155 of a substrate 160. One such transistor includes n+ doped regions 162, 164, a gate 182 formed at a region 166 between n+ doped regions 162, 164. Gate 182 and terminal contacts 180, 182 receive signaling to aid in activation of a channel under region 166. In the case of memory device 150, the memory cell includes a capacitor 190 to store charge exchanged via the channel, where capacitor 190 is outside of substrate 160 and extends vertically up from side 155. The above-substrate capacitor architecture of memory device 150 tends to limit device scaling at least insofar as capacitor 190 interferes with routing of traces in metal layers above side 155.

One of the main limitations to further scaling of DRAM, embedded DRAM (eDRAM) and other memory cell types is the need for sufficient geometric volume within which a capacitor may be fabricated. Scaling of DRAM memory technologies is often constrained by the difficulty associated with the scaling of the geometric size of a capacitor and ability to fabricate this capacitor using conventional processing from the front-side of the wafer. As successive generations of memory technologies continue to scale down in size, there is an increasing demand for incremental improvements in the amount of capacitance available to individual memory cells.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously include techniques and/or mechanisms to provide capacitance for operation of a memory cell of an integrated circuit device. In some embodiments, integrated circuitry includes a memory cell comprising one or more transistors, structures of which are formed in or on a first side of a substrate. The integrated circuitry may further comprise capacitive structure to store charge based on activation of a channel by the one or more transistors. The capacitive structures may be disposed at least in part below the first side—e.g., where a capacitor of the memory cell is formed via processing on a back side (opposite the first side) of the substrate and/or the capacitor does not extend to the first side of the substrate.

As used herein with respect to a substrate of an integrated circuit device, "front side" (unless otherwise indicated) refers to a side of the substrate on which structures of a transistor are disposed and/or in which structures of the transistor extend. Such structures may include a doped region of the substrate—e.g., where the doped region is to serve as a source of the transistor or a drain of the transistor. Alternatively or in addition, such structures may include a gate that is disposed directly or indirectly on the front side of the substrate. Operation of the transistor may include activation of a channel that is to exchange current, between a source and a drain, in a region of the substrate that adjoins the front side. As used herein with respect to a substrate, "back side" refers to a side of the substrate is opposite to the front side of that substrate—e.g., where the front side and back side extend in respective planes that are parallel to, and offset from, one another. A structure may be considered to be "above" a front side of a substrate where the structure is in direct contact with the front side or, alternatively, is coupled to the substrate via another structure on the front side.

Similarly, a structure may be considered to be "below" (or "under") a back side of a substrate where the structure is in contact with back side or, alternatively, is coupled to the substrate via another structure on the back side.

Features of various embodiments are described herein with reference to providing capacitance in a DRAM memory cell. However, such discussion may be extended to additionally or alternatively apply to the exchanging of any of a variety of other memory cell types adaptable to features described herein. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including an IC memory device.

Figure 2:
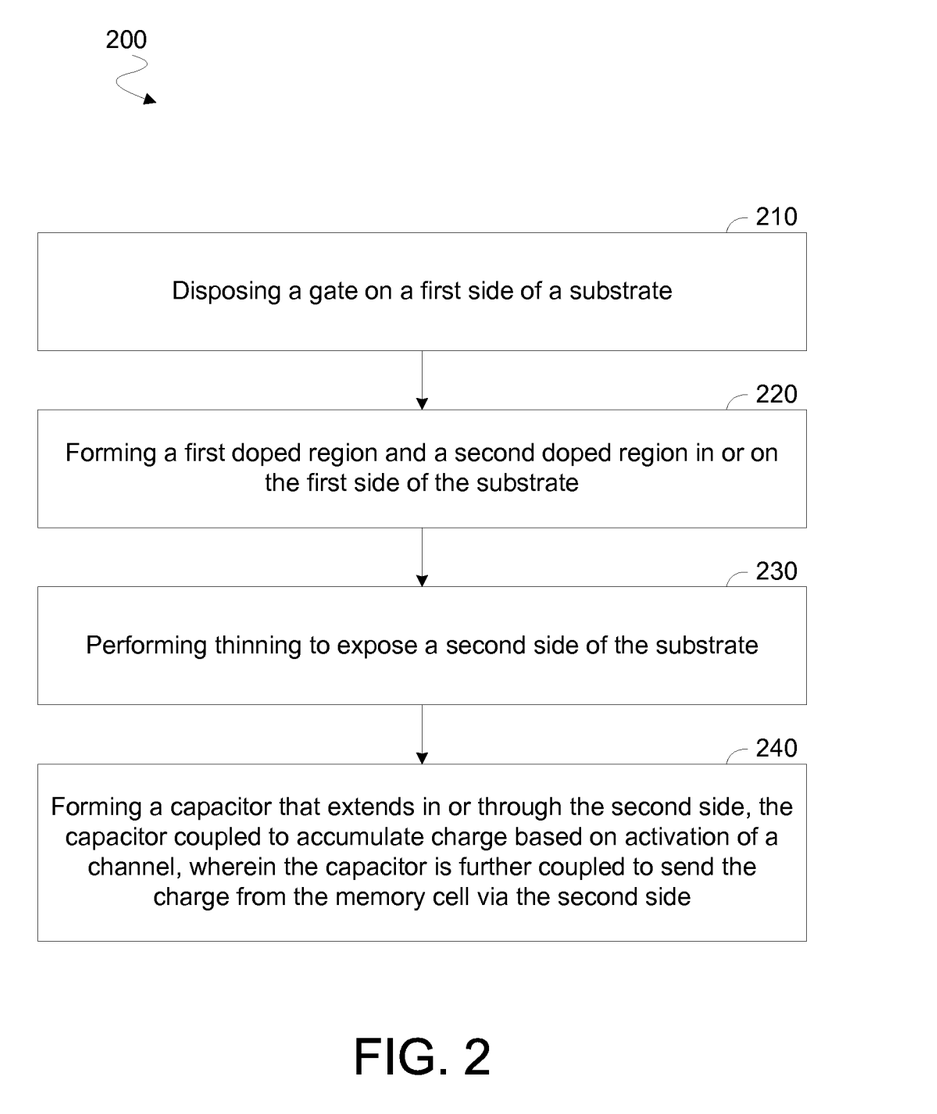
FIG. 2 is a flow diagram illustrating elements of a method to fabricate a memory device according to an embodiment.

FIG. 2 illustrates elements of a method 200 for providing capacitive structures of an integrated circuit device according to an embodiment. Method 200 is one example of an embodiment that utilizes a back side reveal process to enable formation of a capacitor in or on a back side of a substrate. Such processing may mitigate certain limitations imposed on the scaling of existing memory architectures and fabrication techniques. For example, processing techniques according to some embodiments variously reduce or eliminate the need for certain types of front side metal routing and/or may allow for relatively large capacitor structures for a memory cell.

Method 200 may include operations to fabricate a memory cell including a transistor and a capacitor. Although certain embodiments are not limited in this regard, the memory call may include a DRAM cell, for example. Alternatively or in addition, a transistor of the memory cell may be a FinFET transistor. In an embodiment, method 200 comprises, at 210, disposing a gate of the transistor on a first side of a substrate. The substrate may include any of a variety of silicon and/or other semiconductor materials that are used in conventional wafer fabrication processes. In some embodiments, the substrate further comprises an epitaxial layer formed on the substrate material, where the epitaxial layer forms the first (e.g., front) side of the substrate. The particular materials, thickness, crystal structures, doping etc. of the substrate may be adapted from conventional wafer processing techniques, which are not detailed herein and are not limiting on various embodiments. The disposing at 210 may include patterned deposition on the first side to form an insulating layer (e.g., an oxide) and a metal, polysilicon or other conductive material of the gate.

Method 200 may further comprise, at 220, forming a first doped region and a second doped region in or on the first side of the substrate. The forming at 220 may include performing doping through the first side to form in the substrate one or more transistor source regions and/or transistor drain regions. Certain features of various embodiments are described herein with respect to a transistor including n+ doped source and drain regions. However, a transistor of a memory cell according to different embodiments may include any of a variety of other doping schemes—e.g., adapted from conventional transistor designs.

In an embodiment, the disposing at 210 and/or the forming at 220 includes operations adapted from any of a variety of mask, metal deposition, doping and/or other processes for fabricating transistor structures according to existing techniques.

At 230, method 200 may include performing thinning to expose a second side of the substrate, the second side opposite the first side. The thinning at 230 may include grinding, wet etching, chemical mechanical polishing (CMP) and/or other such processes to remove semiconductor material from the substrate. Such thinning may be performed, for example, after the disposing at 210 and/or after the forming at 220. In an embodiment, the thinning at 230 results in an overall thickness between the first side and the exposed second side which allows for etching, deposition and/or other processing to form capacitive structures that are coupled to a doped region formed at 220.

For example, method 200 may further comprise, at 240, forming a capacitor in or on the second side after the thinning at 230. The capacitor may include a first conductive region, a second conductive region and a dielectric disposed between the first conductive region and the second conductive region. In an embodiment, one of the conductive regions forms one or more lobe structures that extend at least in part between the first side and the back side. Alternatively or in addition, the capacitor may form one or more of horizontal branch portion, a vertical branch portion and/or other such structures to aid in increasing capacitance of the memory cell. One of the doped regions may be disposed between the capacitor and the first side—e.g. where the capacitor does not extend to the first side. In another embodiment, the second doped region is disposed on the first side, wherein the second doped region surrounds the capacitor at the first side.

In one embodiment, forming the capacitor at 240 includes etching through a hole in a patterned mask to form through the back side a recess that extends to the second doped region (or in an alternate embodiment, the first doped region). Alternatively or in addition, the forming at 240 may include depositing a dielectric material that is to be located between conductive structures—e.g., to form a metal-insulator-metal (m-i-m) capacitor. After the forming at 240, a doped region—e.g., the second doped region—may be between the capacitor and the first side of the substrate. For example, the capacitor formed at 240 may be below the first side, and coupled to accumulate charge based on activation of a channel between the first doped region and the second doped region. In some embodiments, method 200 further forms one or more other capacitors of the memory cell—e.g., including forming a capacitor in or on the first side (according to conventional techniques) and/or another capacitor that is also coupled to exchange current via the back side of the substrate.

Figure 3:
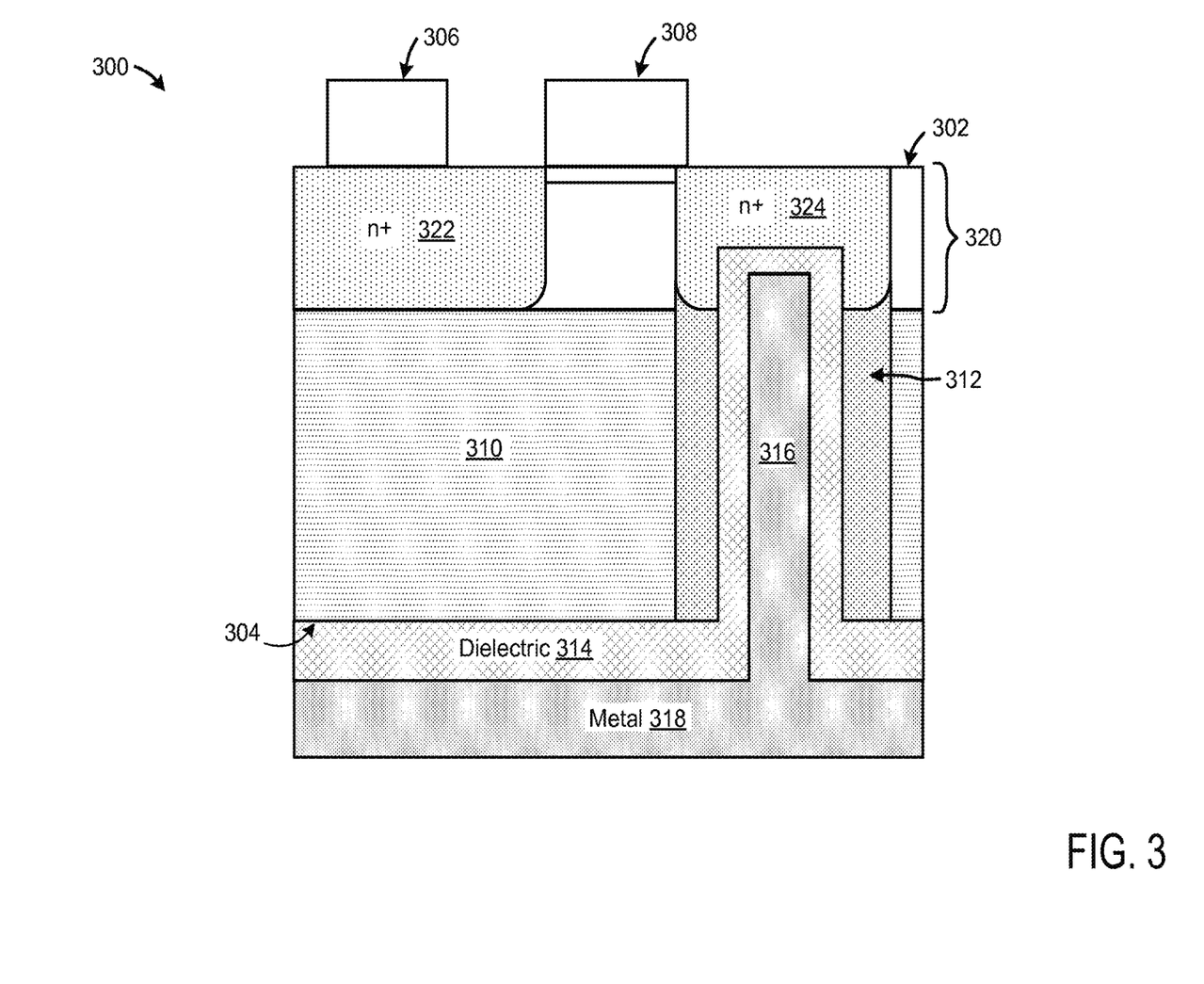
FIG. 3 is a cross-sectional view of memory cell structures according to an embodiment.

FIG. 3 shows elements of an integrated circuit (IC) device 300 comprising capacitive structures of a memory cell—e.g., a DRAM cell—according to an embodiment. IC device 300 is just one example of an embodiment including a memory cell having transistor structures variously formed in or on a first (front) side of a substrate, and a capacitor that extends through and/or in a second (back) side of the substrate opposite the first side—e.g., where the capacitor is disposed entirely below the first side. IC device 300 may be manufactured by fabrication processes such as those of method 200, for example.

In the illustrative embodiment shown, a memory cell of IC device 300 includes transistor structures variously disposed in or on a front side 302 of a substrate—e.g., the front side 302 formed by an epitaxial layer 320 of the substrate. By way of illustration and not limitation, a transistor of the memory cell may include doped regions 322, 324 (e.g., including respective n+ doping) disposed in epitaxial layer 320, the doped regions 322, 324 to serve, respectively, as a transistor source and a transistor drain. The transistor may further comprise a gate structure 308 formed on side 302 over a depletion region between doped regions 322, 324. Operation of the transistor may be responsive at least in part to signals variously received via gate structure 308 and a terminal contact 306 (e.g., a source terminal)—e.g., where such signals facilitate activation of a channel to exchange charge between doped regions 322, 324.

The memory cell of IC device 300 may further comprise a capacitor to store charge exchanged via the channel—e.g., where the capacitor is to receive such charge from doped region 324. In one embodiment, the capacitor includes a dielectric 314 disposed between two conductive structures, such as the illustrative conductive region 312 and metal 318. Structures of the capacitor—e.g., including a dielectric material and/or one or more conductive materials adapted from conventional DRAM capacitive structures—may be disposed at least in part in or on a back side 304 of the substrate. Dielectric 314 may include oxide, oxynitride and/or any of a variety of other materials adapted from conventional memory device designs. By way of illustration and not limitation, a material of dielectric 314 may have a dielectric constant of 3.8 or more and, in some embodiments, 7.3 or more. The conductive region 312 may comprise a relatively highly doped polysilicon and/or a metal—such as copper (Cu), tantalum (Ta), aluminum (Al), permalloy a nickel-iron (Ni—Fe) alloy, platinum (Pt), etc.—in some embodiments.

The substrate may further comprise one or more structures to provide at least partial electrical isolation of the capacitor. For example, an oxide or other insulation material—e.g., the illustrative insulation gap fill material 310—may extend between sides 302, 304 and separate at least some of the capacitor structure from semiconductor material (not shown) of the substrate that also extends between sides 302, 304. In the illustrative embodiment shown, metal 318 forms a branch structure 316 that extends perpendicularly from side 304 toward doped region 324. Structure 316 may allow for increased surface area between dielectric 314 and adjoining conductive structures, which in turn results in increased capacitance of the memory cell. Gap fill material 310 may extend around branch structure 316 and portions of conductive region 312 and dielectric 314 that also extend around branch structure 316.

Figure 4A:
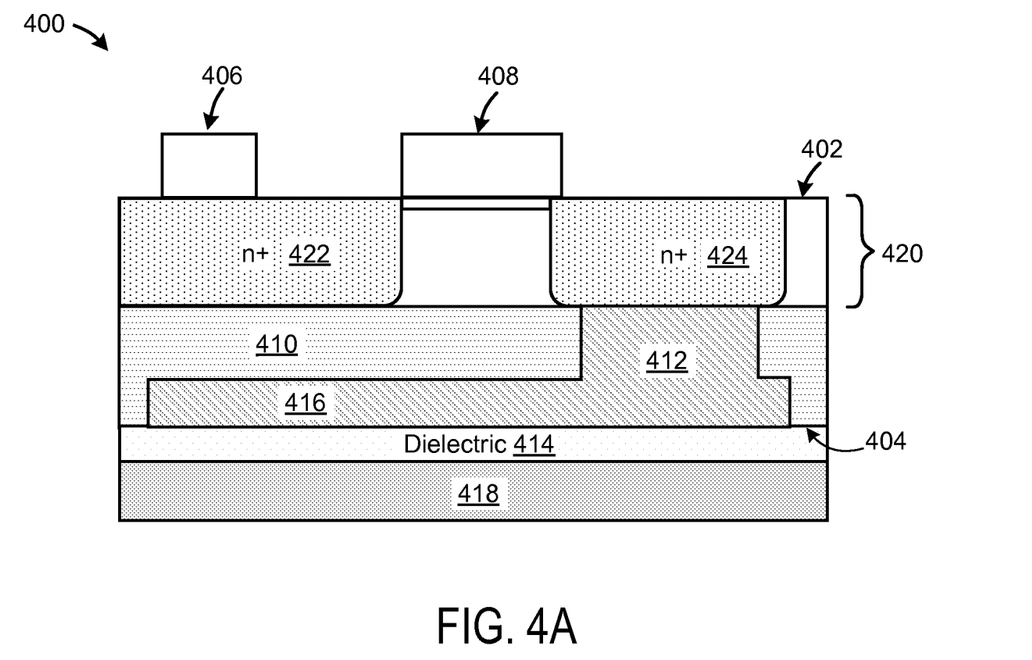
FIGS. 4A, 4B are cross-sectional views of respective memory cell structures each according to a corresponding embodiment.

FIG. 4A shows a memory cell of an IC device 400 according to another embodiment. Fabrication of IC device 400 may be according to method 200, for example. In the illustrative embodiment shown, IC device 400 includes a substrate having a front side 402 and a back side 404, where a memory cell of IC device 400 includes a transistor comprising doped regions 422, 424 (corresponding functionally to doped regions 322, 324) variously disposed at and under front side 402. For example, doped regions 422, 424 may be n+ doped regions each in an epitaxial layer 420 of the substrate. The transistor may further comprise a terminal contact 406 and a gate structure 408—e.g., corresponding functionally to terminal contact 306 and gate structure 308, respectively.

The memory cell may further comprise a capacitor to store charge based on activation of channel between doped regions 422, 424. For example, the capacitor may include a dielectric 414 and—on opposite sides of dielectric 414—two conductive structures such as the illustrative conductive region 412 and metal 418. In one embodiment, conductive region 412 comprises a polysilicon (e.g., n+ doped) or other such doped semiconductor material. In another embodiment, conductive region 412 includes copper (Cu), tantalum (Ta), aluminum (Al), permalloy a nickel-iron (Ni—Fe) alloy, platinum (Pt) or any of a variety of other metals (e.g., the same as metal 318) used in conventional IC capacitor structures.

Dielectric 414 may form a planar structure that extends along and/or in side 404—e.g., in parallel with side 404. In an embodiment, capacitance of the memory cell may be increased by a branch structure 416 of region 412 that extends horizontally from under doped region 424 and along a surface of the dielectric 414. At least partial electrical isolation of the capacitor may be provided by an insulation gap fill material 410 that extends, for example, between region 412 and semiconductor material (not shown) of the substrate that extends between sides 402, 404. In some embodiments, one or more isolation trench structures may include or adjoin gap fill material 410, where such trench structures aid in isolation of the capacitor from another memory cell (not shown) of IC device 400.

Figure 4B:
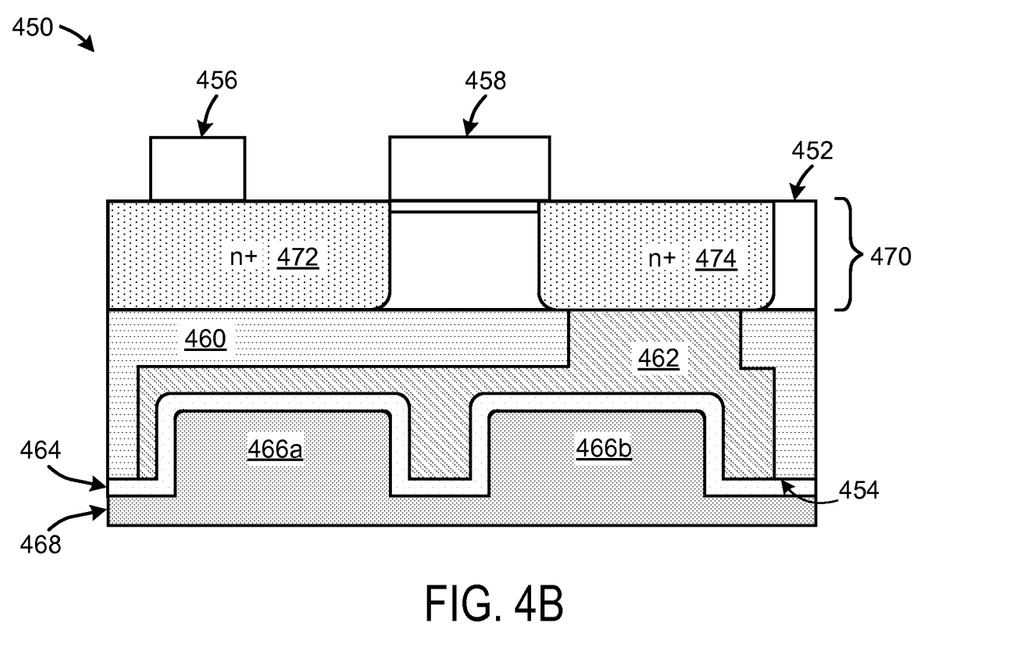

FIG. 4B shows a memory cell of an IC device 450 according to another embodiment. Fabrication of IC device 450 may include some or all operations of method 200, for example. IC device 450 includes a substrate having a front side 452 and a back side 454, where a memory cell of IC device 450 includes a transistor comprising doped regions 472, 474 each disposed at and under front side 452—e.g., in an epitaxial layer 470 of the substrate. The memory cell may further comprise a terminal contact 456 and a gate structure 458 that, for example, correspond functionally to terminal contact 306 and gate structure 308, respectively.

The memory cell of IC device 450 may further comprise a capacitor including a dielectric 464 and—on opposite sides of dielectric 464—a conductive region 462 and a metal 468. Conductive region 462 may have features of conductive region 412, for example. Dielectric 464 may extend at least in part on side 454. In one embodiment, metal 468 forms one or more lobes 466a, 466b that variously extend through side 454 toward side 452. Dielectric 464 may conform to such one or more lobes 466a, 466b and also extend at least in part through side 454. The one or more lobes 466a, 466b may facilitate increased capacitance of the memory cell by increasing the surface area between dielectric 464 and adjoining conductive structures of conductive region 462 and metal 468. In an embodiment, electrical isolation of the capacitor may be provided at least in part with an insulation gap fill material 460 (such as that of gap fill material 410) that extends between sides 452, 454 and at least partially around a portion of conductive region 462.

Figure 5A:
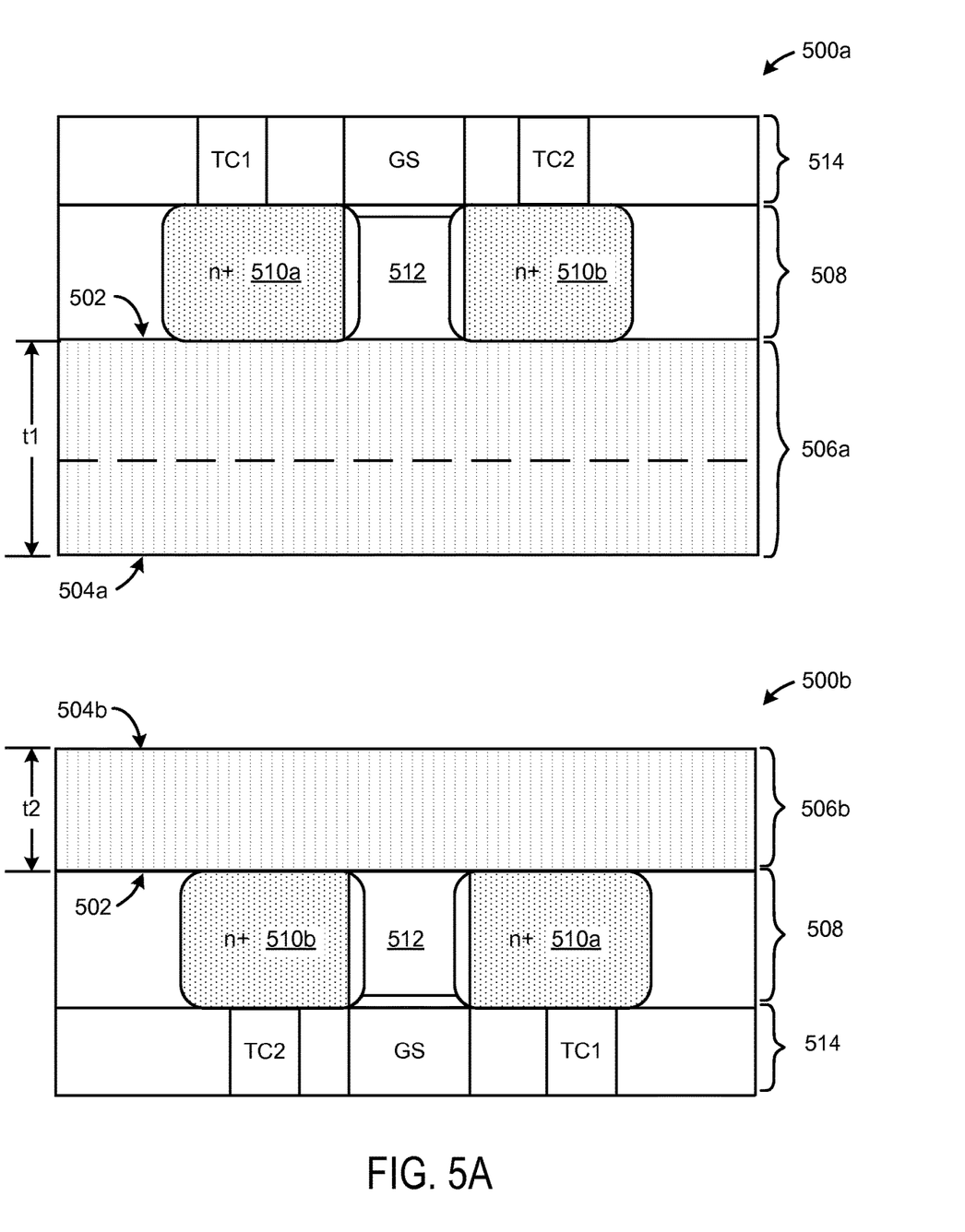
FIGS. 5A-5C are cross-sectional views of integrated circuit structures during processing to fabricate a memory cell according to an embodiment.
Figure 5B:
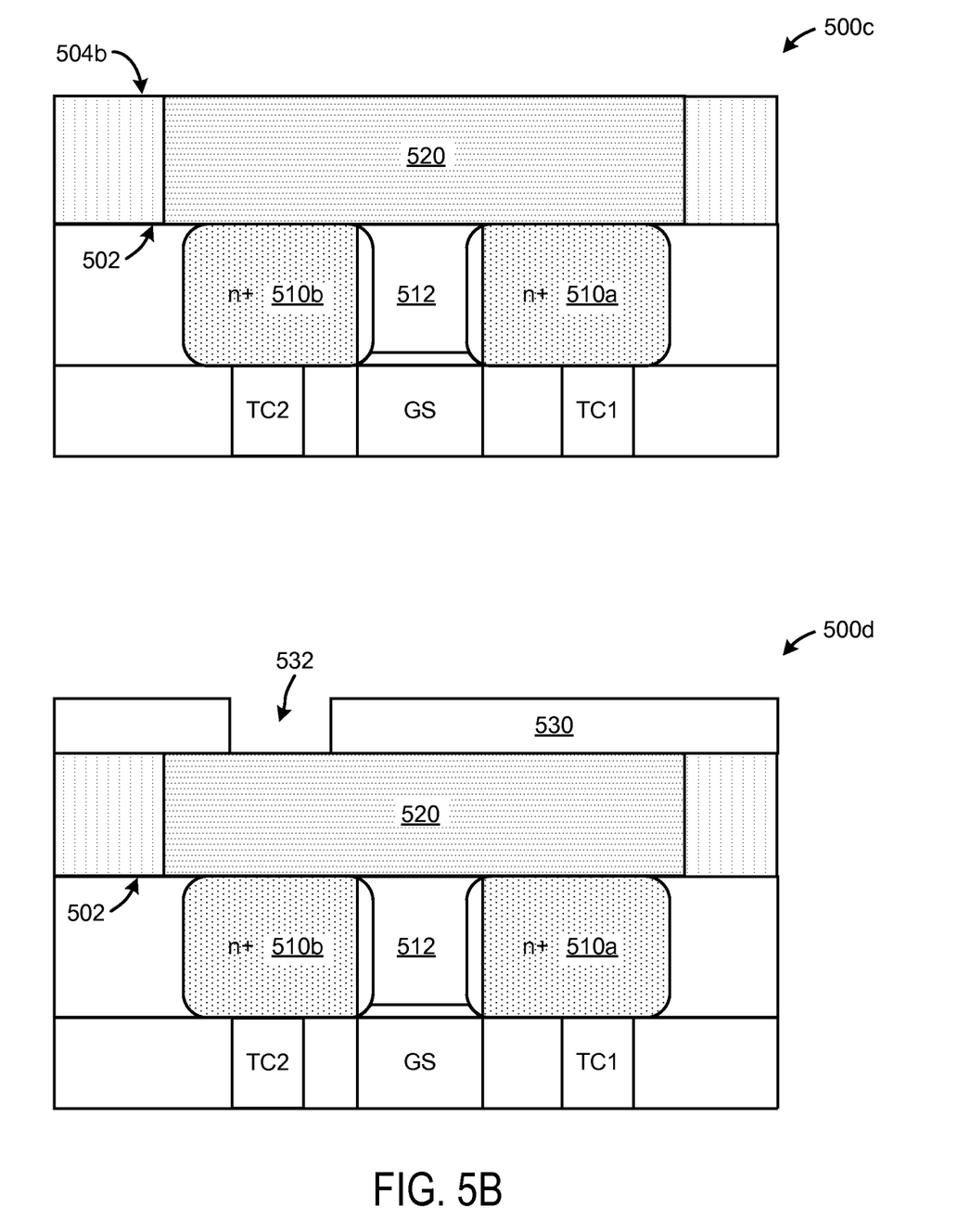
Figure 5C:
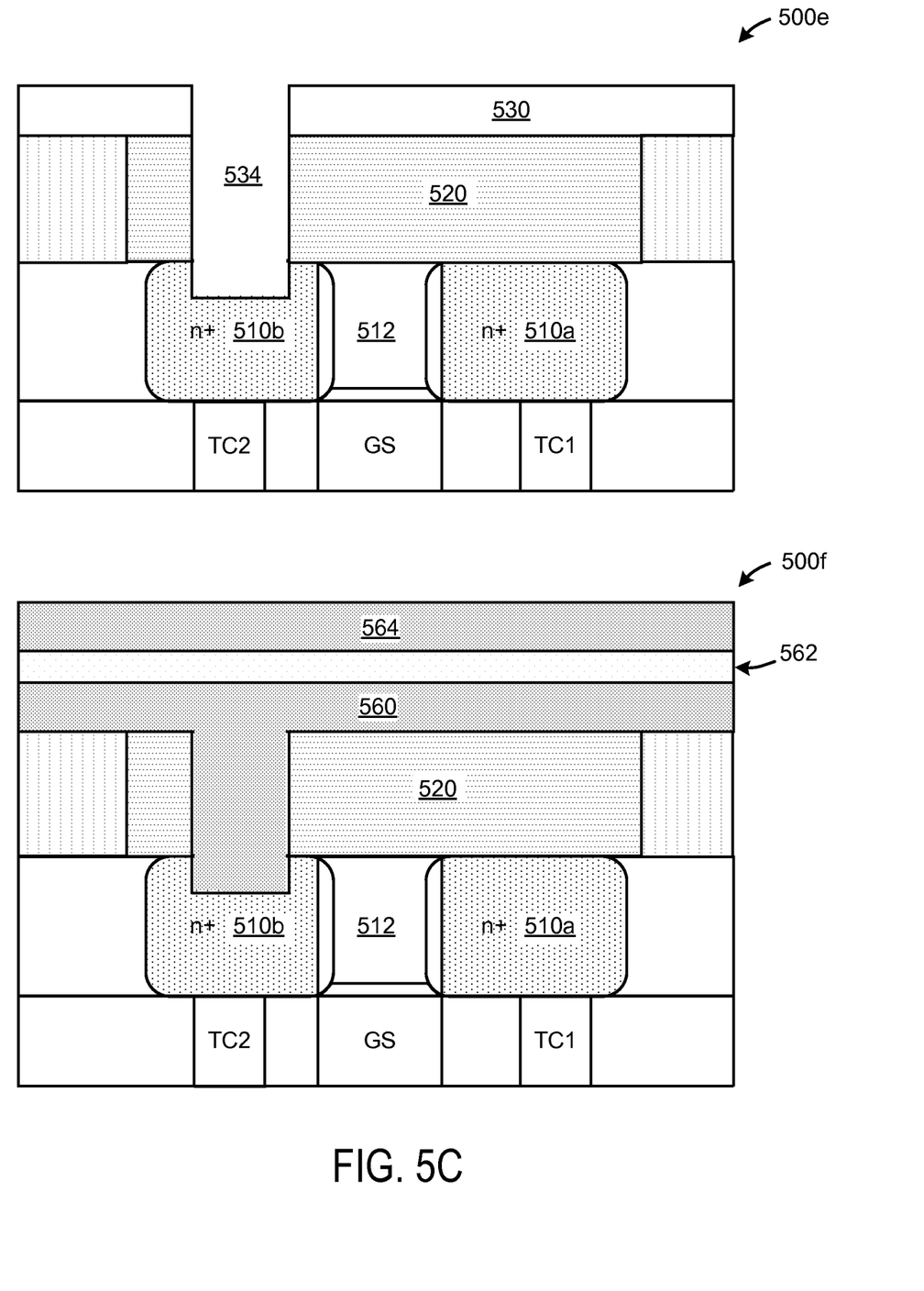

FIGS. 5A-5C show various cross-sectional views of structure during respective stages 500a-500f of processing to fabricate a memory cell according to an embodiment. The processing represented in FIGS. 5A-5C may include some or all operations of method 200, for example. In an embodiment, such processing is to provide integrated circuitry having features of one or all of IC devices 300, 400, 450 and/or any of a variety of other devices having capacitive structures described herein.

At represented in stage 500a, structures 508 of a transistor may be variously disposed in or on a front side 502 of a wafer 506a, where an eventually-formed substrate is to include semiconductor material of wafer 506a. In the illustrative embodiment, the transistor is of a type that is commonly referred to as a fin field effect transistor (FET), or "FinFET"—e.g., where structures 508 include doped regions 510a, 510b and a depletion region 512 (between doped regions 510a, 510b) that all extend above front side 502. A gate structure GS may extend both over depletion region 512 and along opposing sidewalls of depletion region 512. For example, at least part of gate structure GS may extend in a metal layer 514 above structures 508—along with source and drain terminal contacts TC1, TC2 of the transistor—as well as along sides of depletion region 512 at least partially toward side 502. Although doped regions 510a, 510b are shown as being n+ doped—e.g., where wafer 506a includes p+ doped semiconductor—any of a variety of other combinations of doping may be provided by the substrate and respective components of the transistor, according to different embodiments.

Processing after stage 500a may include inverting or otherwise orienting and positioning wafer 506a, structures 508 and metal layer 514 for thinning that is to remove some of the substrate material of wafer 506a. For example, a handling wafer (not shown) may be coupled to wafer 506a via front side 502 (e.g., indirectly via structures 508 and metal layer 514), where the handling layer is to provide mechanical support during thinning of wafer 506a. Such thinning—which, for example, may include grinding, wet etching, chemical mechanical polishing (CMP) and/or other such processes—may result in the formation of a substrate 506b from wafer 506a. In one illustrative embodiment, wafer 506a, which has a thickness t1 from a back side 504a that, for example, may be on the order of several hundred micrometers (um)—e.g., in a range of 200-500 um—or, in the case of a membrane type substrate, in a range of 30-100 um. The thickness t1 may be reduced to a thickness t2 that, for example, is on the order of 1-10 um or, in the case of a membrane type substrate, may be in a range of 50-250 nanometers (nm). As shown at stage 500b, such thinning may expose a back side 504b of substrate 506b that is opposite front side 502.

The thickness t2 resulting from thinning to form substrate 506b may allow for subsequent etching and/or other processing—on or through back side 504b—to form in substrate 506b recess structures extending to structures 508, the recess structures to accommodate a capacitor of the memory cell. As represented in stage 500c, mask and etch processing may be performed to form a recess that extends from side 504b. Such a recess may extend at least partially through the substrate—e.g., to a region at, or proximate to, side 502. Deposition processing may form in such a recess a fill material 520 (e.g., an oxide) that is to provide for at least some insulation of the capacitor. Subsequently, at stage 500d, a pattered mask 530 may be formed on back side 504b, the mask 530 including a hole 532 through which etching of fill material 520 is performed. As illustrated by stage 500e, etching through the patterned mask 530 may form a recess 534 extending from back side 504b, through fill material 520, to (and in some embodiments, into) doped region 510b. After formation of the recess 534, fill metal 560 may be plated and/or otherwise deposited therein to form a conductive structure of the capacitor. In an embodiment, a layer 562 of dielectric material and a metal layer 564 may then be successively deposited on fill metal 560. Fill metal 560, dielectric layer 562 and metal layer 564 may form a m-i-m capacitor that is coupled to exchange charge with doped region 510b. In an embodiment, such charge may be further exchanged to or from the capacitor via a conductive path that extends from the transistor via back side 504b—e.g., as opposed to exchanging such charge via a conductive path formed in or above metal layer 514.

Figure 6:
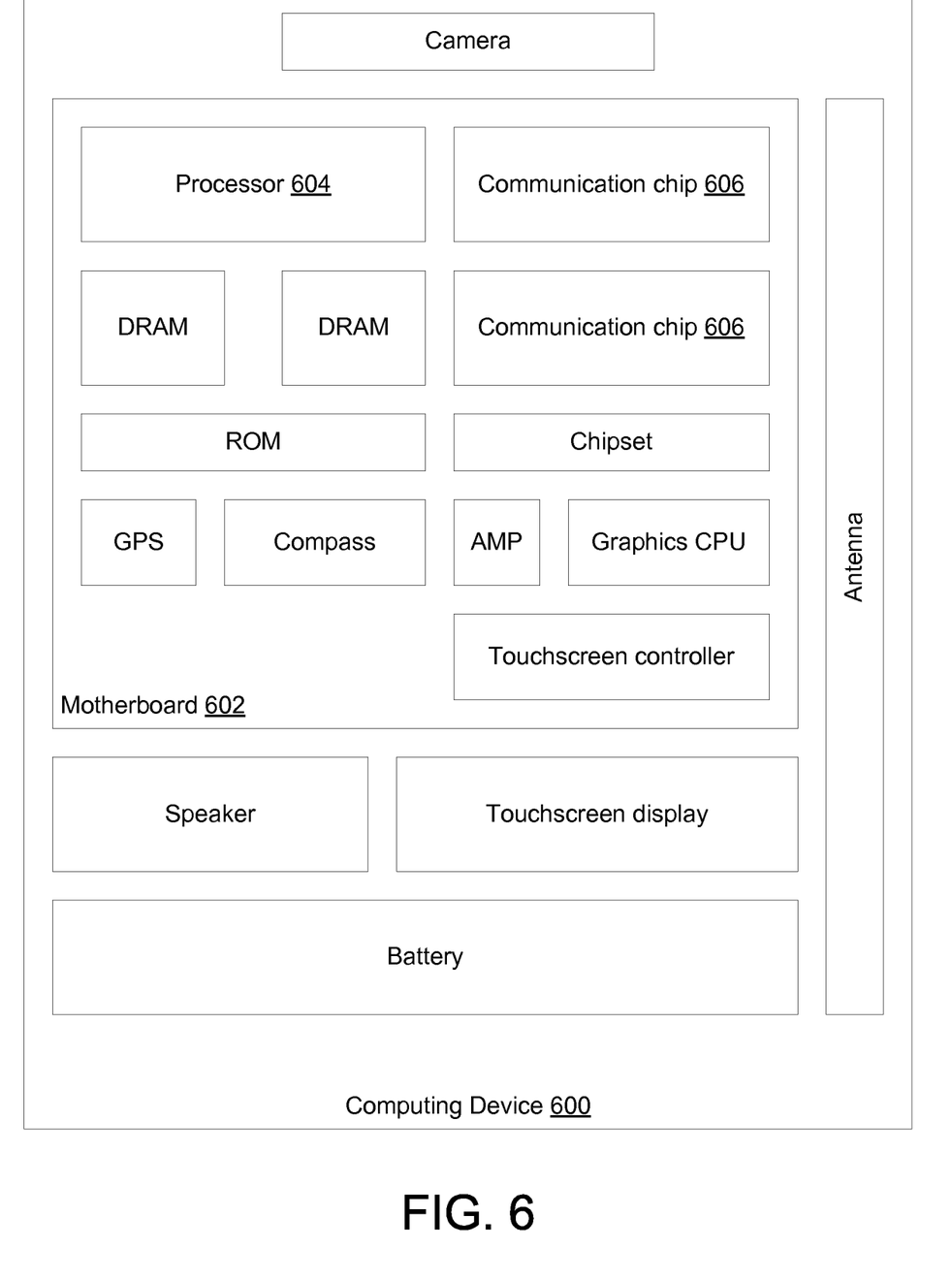
FIG. 6 illustrates a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
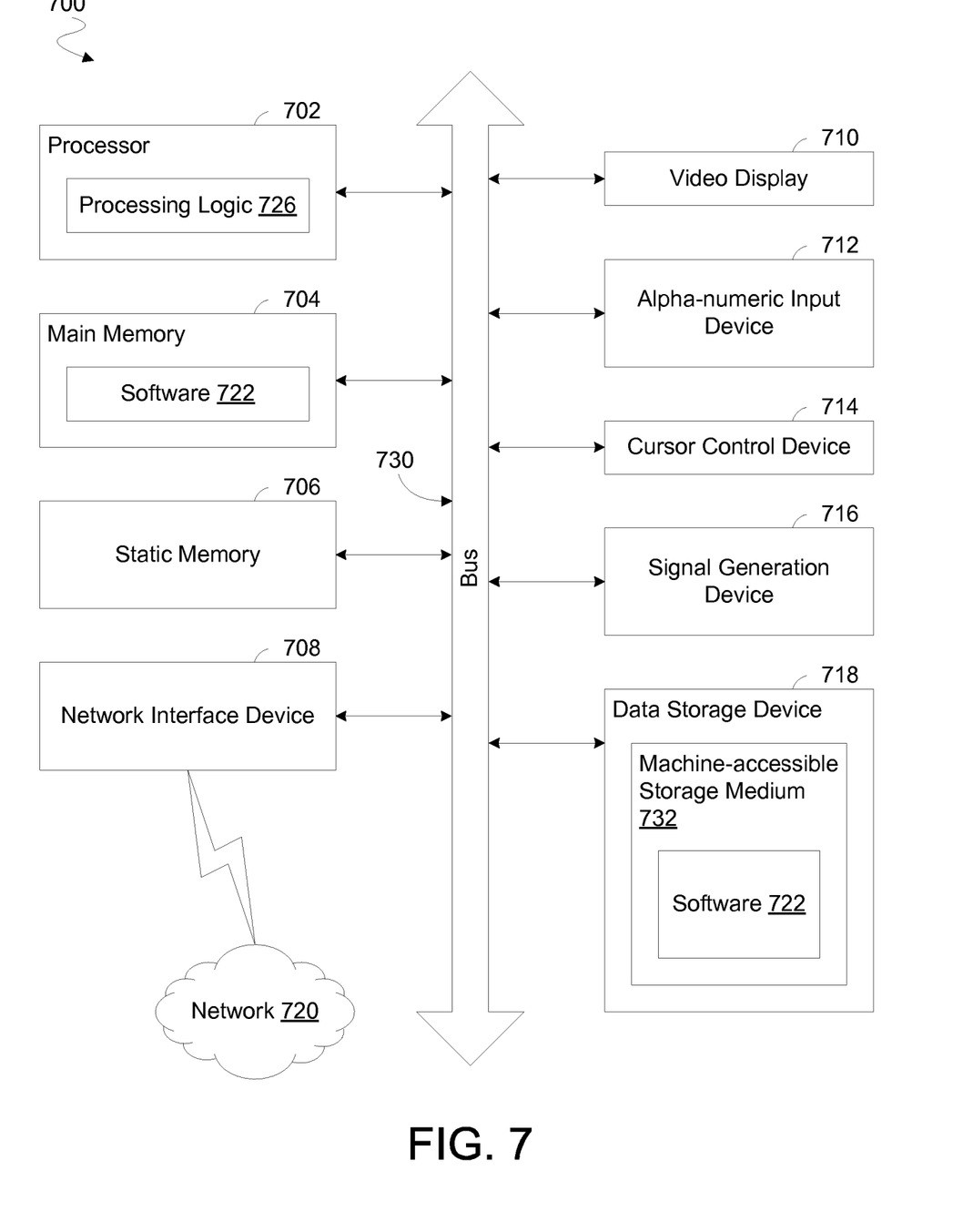
FIG. 7 illustrates a block diagram of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of various embodiments. The term "machine-readable storage medium" shall accordingly be taken to include, but not be limited to, solid-state memories, and optical and magnetic media.

Figure 8:
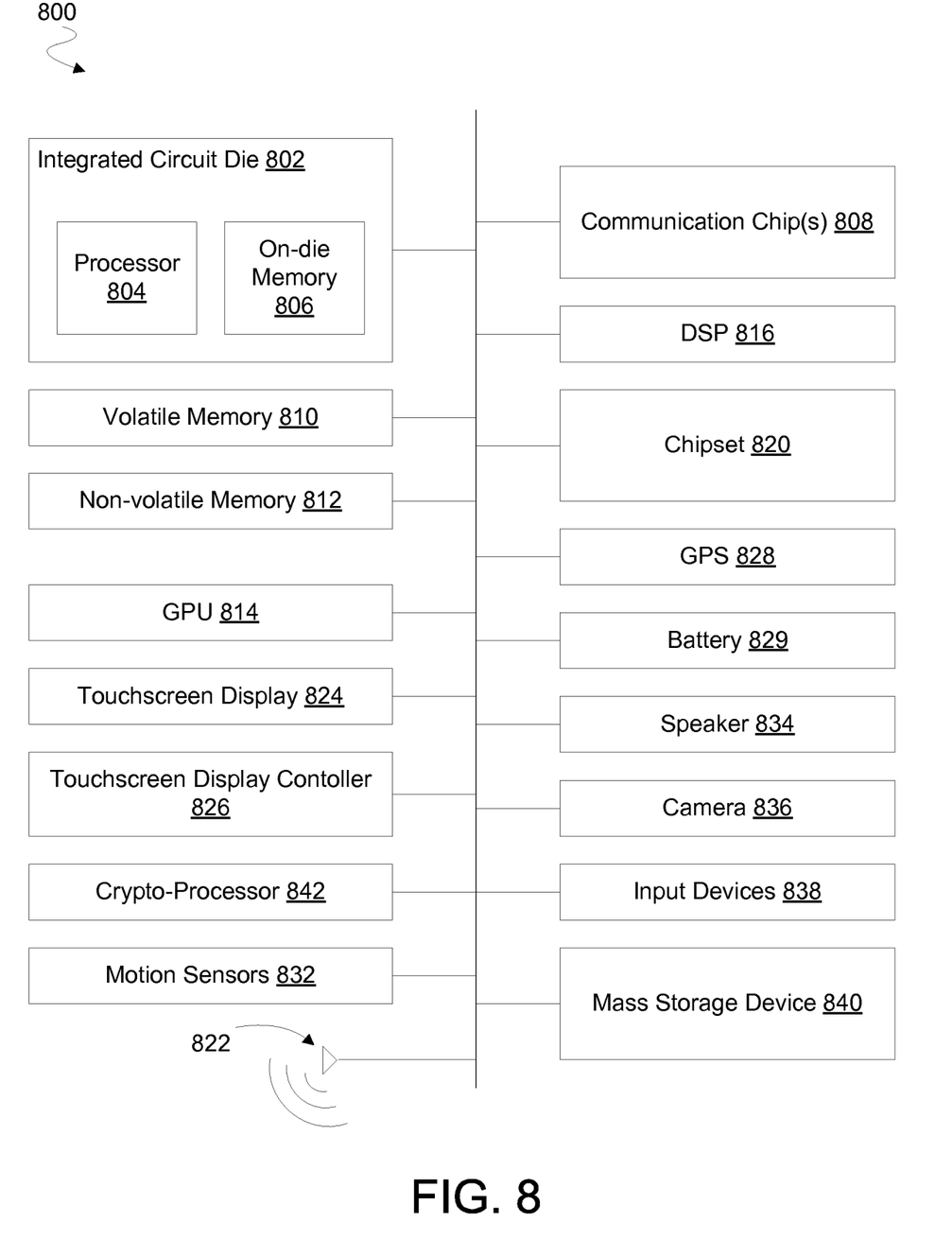
FIG. 8 is a computing device built in accordance with an embodiment.

FIG. 8 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, an integrated circuit comprises a substrate and a memory cell including a first transistor comprising a first doped region disposed at least in part in or on a first side of the substrate, a second doped region disposed at least in part in or on a first side of the substrate, and a gate disposed on the first side, the gate coupled to receive a signal and, responsive to the signal, to activate a channel between the first doped region and the second doped region. The memory cell further comprises a capacitor coupled to accumulate charge based on activation of the channel, wherein the capacitor is further coupled to send the charge from the memory cell via a second side of the substrate, the second side opposite the first side.

In an implementation, the second doped region is disposed between the capacitor and the first side. In another implementation, the second doped region is disposed on the first side, and wherein the second doped region surrounds the capacitor at the first side. In another implementation, the capacitor includes a branch structure that extends to the second doped region in a direction perpendicular to the second side. In another implementation, the capacitor includes a branch structure that extends in a direction parallel to the second side. In another implementation, the capacitor includes a first conductive region, a second conductive region and a dielectric disposed between the first conductive region and the second conductive region, wherein the first conductive region forms one or more lobe structures extending between the first side and the back side. In another implementation, the memory cell is a dynamic random access memory cell. In another implementation, the transistor is a fin field effect transistor. In another implementation, the memory cell further comprises another capacitor coupled to accumulate other charge based on activation of the channel, wherein the other capacitor is coupled to the substrate via the first side or the other capacitor extends from the second doped region via the first side.

In another implementation, a method comprises forming a first transistor of a memory cell, including disposing a gate on a first side of a substrate, and forming a first doped region and a second doped region in or on the first side of the substrate. The method further comprises performing thinning to expose a second side of the substrate, the second side opposite the first side, and after the thinning, forming a capacitor that extends in or through the second side, wherein the capacitor is coupled to accumulate charge based on activation of a channel between the first doped region and the second doped region, wherein the capacitor is further coupled to send the charge from the memory cell via the second side.

In an implementation, the second doped region is disposed between the capacitor and the first side. In another implementation, the second doped region is formed on the first side, and wherein the second doped region surrounds the capacitor at the first side. In another implementation, forming the capacitor includes forming a branch structure that extends to the second doped region in a direction perpendicular to the second side. In another implementation, forming the capacitor includes forming a branch structure that extends in a direction parallel to the second side. In another implementation, forming the capacitor includes forming a first conductive region, a second conductive region and a dielectric disposed between the first conductive region and the second conductive region, the first conductive region including one or more lobe structures extending between the first side and the back side. In another implementation, the memory cell is a dynamic random access memory cell. In another implementation, the transistor is a fin field effect transistor. In another implementation, the method further comprises forming another capacitor of the memory cell, wherein the other capacitor is coupled to accumulate other charge based on activation of the channel, wherein the other capacitor is coupled to the substrate via the first side or the other capacitor extends from the second doped region via the first side.

In another implementation, a system comprises an integrated circuit including a substrate, a memory cell including a first transistor comprising a first doped region disposed at least in part in or on a first side of the substrate, a second doped region disposed at least in part in or on a first side of the substrate, and a gate disposed on the first side, the gate coupled to receive a signal and, responsive to the signal, to activate a channel between the first doped region and the second doped region. The memory cell further comprises a capacitor coupled to accumulate charge based on activation of the channel, wherein the capacitor is further coupled to send the charge from the memory cell via a second side of the substrate, the second side opposite the first side. The system further comprises a display device coupled to the integrated circuit, the display device to display an image based on the charge sent from the memory cell via the second side.

In an implementation, the second doped region is disposed between the capacitor and the first side. In another implementation, the second doped region is disposed on the first side, and wherein the second doped region surrounds the capacitor at the first side. In another implementation, the capacitor includes a branch structure that extends to the second doped region in a direction perpendicular to the second side. In another implementation, the capacitor includes a branch structure that extends in a direction parallel to the second side. In another implementation, the capacitor includes a first conductive region, a second conductive region and a dielectric disposed between the first conductive region and the second conductive region, wherein the first conductive region forms one or more lobe structures extending between the first side and the back side. In another implementation, the memory cell is a dynamic random access memory cell. In another implementation, the transistor is a fin field effect transistor. In another implementation, the memory cell further comprises another capacitor coupled to accumulate other charge based on activation of the channel, wherein the other capacitor is coupled to the substrate via the first side or the other capacitor extends from the second doped region via the first side.

Techniques and architectures for providing integrated circuitry of a memory are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
   a substrate;
   a memory cell including a first transistor comprising:
     a first doped region disposed at least in part in or on a first side of the substrate;
     a second doped region disposed at least in part in or on a first side of the substrate;
     a gate disposed on the first side, the gate coupled to receive a signal and, responsive to the signal, to activate a channel between the first doped region and the second doped region; and
     a capacitor coupled to accumulate charge based on activation of the channel, wherein the capacitor is further coupled to send the charge from the memory cell via a second side of the substrate, the second side opposite the first side, wherein the capacitor includes a first conductive region, a second conductive region and a dielectric disposed between the first conductive region and the second conductive region, wherein the first conductive region of the capacitor at least partially laterally surrounds the second conductive region of the capacitor, and wherein the second doped region is in direct physical contact with the first conductive region, and the second doped region is at least partially vertically over the first conductive region of the capacitor from a cross-sectional perspective.

2. The integrated circuit of claim 1, wherein the second doped region is disposed between the capacitor and the first side.

3. The integrated circuit of claim 1, wherein the second doped region is disposed on the first side, and wherein the second doped region surrounds the capacitor at the first side.

4. The integrated circuit of claim 1, the capacitor including a branch structure that extends to the second doped region in a direction perpendicular to the second side.

5. The integrated circuit of claim 1, the capacitor including a branch structure that extends in a direction parallel to the second side.

6. The integrated circuit of claim 1, wherein the first conductive region forms one or more lobe structures extending between the first side and the back side.

7. The integrated circuit of claim 1, wherein the memory cell is a dynamic random access memory cell.

8. The integrated circuit of claim 1, wherein the transistor is a fin field effect transistor.

9. The integrated circuit of claim 1, the memory cell further comprising another capacitor coupled to accumulate other charge based on activation of the channel, wherein the other capacitor is coupled to the substrate via the first side or the other capacitor extends from the second doped region via the first side.

10. A system comprising:
an integrated circuit including:
a substrate;
a memory cell including a first transistor comprising:
    a first doped region disposed at least in part in or on a first side of the substrate;
    a second doped region disposed at least in part in or on a first side of the substrate;
    a gate disposed on the first side, the gate coupled to receive a signal and, responsive to the signal, to activate a channel between the first doped region and the second doped region; and
    a capacitor coupled to accumulate charge based on activation of the channel, wherein the capacitor is further coupled to send the charge from the memory cell via a second side of the substrate, the second side opposite the first side, wherein the capacitor includes a first conductive region, a second conductive region and a dielectric disposed between the first conductive region and the second conductive region, wherein the first conductive region of the capacitor at least partially laterally surrounds the second conductive region of the capacitor, and wherein the second doped region is in direct physical contact with the first conductive region, and the second doped region is at least partially vertically over the first conductive region of the capacitor from a cross-sectional perspective; and
a display device coupled to the integrated circuit, the display device to display an image based on the charge sent from the memory cell via the second side.

11. The system of claim 10, wherein the second doped region is disposed between the capacitor and the first side.

12. The system of claim 10, wherein the second doped region is disposed on the first side, and wherein the second doped region surrounds the capacitor at the first side.

13. The system of claim 10, wherein the first conductive region forms one or more lobe structures extending between the first side and the back side.

14. The system of claim 10, the memory cell further comprising another capacitor coupled to accumulate other charge based on activation of the channel, wherein the other capacitor is coupled to the substrate via the first side or the other capacitor extends from the second doped region via the first side.

* * * * *